(12) United States Patent  (10) Patent No.: US 7,615,734 B2
Yoshizu et al.  (45) Date of Patent: Nov. 10, 2009

(54) IMAGE CAPTURE DEVICE

(75) Inventors: Yoshio Yoshizu, Inagi (JP); Hiroyuki Tanaka, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 85 days.

(21) Appl. No.: 12/053,947

(22) Filed: Mar. 24, 2008

(65) Prior Publication Data

US 2008/0230681 A1    Sep. 25, 2008

(51) Int. Cl.
*G03B 15/03* (2006.01)
*H04N 5/222* (2006.01)

(52) U.S. Cl. .................. 250/221; 250/239; 348/175

(58) Field of Classification Search ............. 250/239, 250/221; 396/14, 15, 18, 199, 164, 182; 348/175, 176, 187, 188
See application file for complete search history.

(56) References Cited

U.S. PATENT DOCUMENTS

| 7,415,202 | B2* | 8/2008 | Fujimoto et al. ............. 396/164 |
| 2003/0131428 | A1* | 7/2003 | Tsuchida ................... 15/104.93 |
| 2006/0110145 | A1 | 5/2006 | Fujimoto et al. |

FOREIGN PATENT DOCUMENTS

| JP | 2001-235071 A | 8/2001 |
| WO | 2004/052171 A2 | 6/2004 |
| WO | 2004/088588 A1 | 10/2004 |

* cited by examiner

*Primary Examiner*—Georgia Y Epps
*Assistant Examiner*—Tony Ko
(74) *Attorney, Agent, or Firm*—Westerman, Hattori, Daniels & Adrian, LLP

(57) ABSTRACT

An image capture device, which illuminates a subject and receives light reflected from the subject to capture an image of the subject, is provided to achieve a small-size configuration and easy assembly. A plurality of light-emitting elements are mounted in positions on the periphery of an image sensor, and a light-guiding member guides light from the plurality of light-emitting elements to the image capture range for illumination. And protrusions of the light-guiding member are pressed by the lower end of a hood which blocks light from outside the image capture range, and the hood upper end is pressed by a filter. Slits are provided in the hood lower end. Even in assembly where a visible light filter is installed on the hood and fixed to an outer case, the occurrence of gaps between the hood and the visible light filter can be prevented through the spring action of the slits.

18 Claims, 13 Drawing Sheets

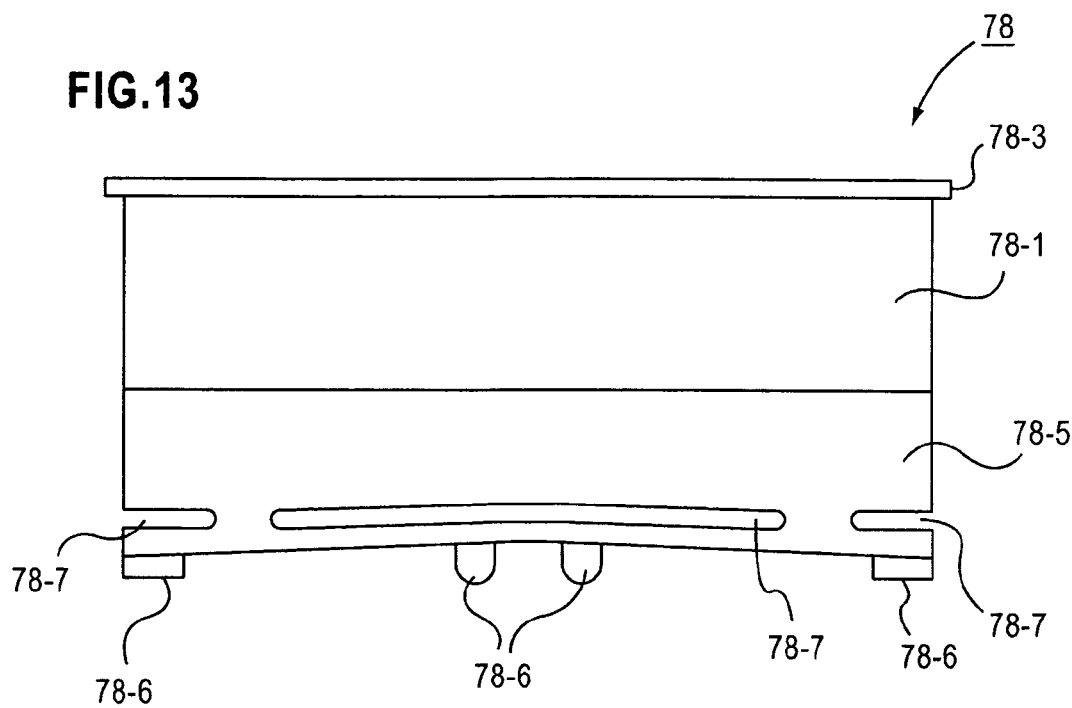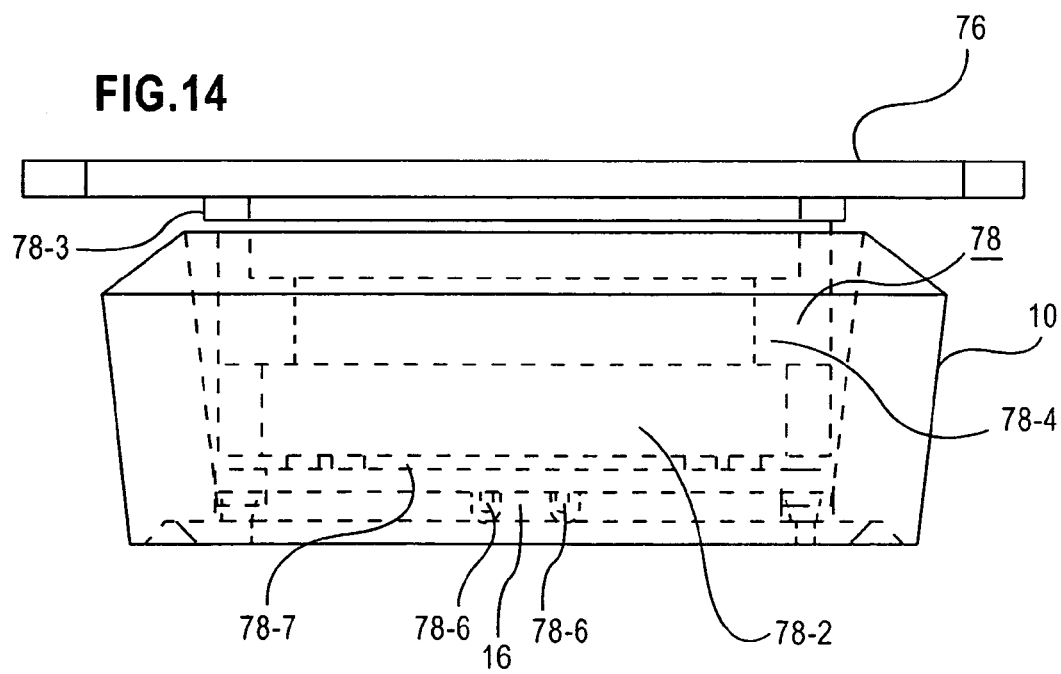

IMAGE CAPTURE DEVICE

CROSS-REFERENCE TO RELATED APPLICATIONS

This application is based upon and claims the benefit of priority from the prior Japanese Patent Application No. 2007-77063, filed on Mar. 23, 2007, the entire contents of which are incorporated herein by reference.

BACKGROUND OF THE INVENTION

1. Field of the Invention

This invention relates to an image capture device which guides light from a light-emitting element to a subject, to irradiate the subject and capture an image, and in particular relates to an image capture device which is compact and easily assembled.

2. Description of the Related Art

Image capture devices which irradiate a subject with uniform light and capture an image of a prescribed range of the subject are in wide use. Distinct captured images are particularly demanded in image processing systems which use images captured by such image capture devices for image processing.

For example, with advances in biometrics technology in recent years, various devices have been provided which capture images and perform recognition of characteristics of portions of the human body enabling distinction among human beings, such as fingerprints and toe-prints, retina patterns of the eyes, facial features, blood vessel patterns, and similar, to perform authentication of individuals.

In particular, comparatively large quantities of individual characteristic data can be obtained from blood vessels in the palms and backs of the hands and the fingers as well as from palm-prints, so that such data is useful to ensure reliability of individual authentication. Further, the patterns of blood vessels (veins) remain unchanged from infancy throughout life, and are thought to be unique to each individual, making them appropriate for use in individual authentication.

In order to perform such biometrics authentication, contact-free image capture of a subject (for biometrics authentication, a portion of the human body) is necessary. To this end, an image capture device emits light of uniform optical intensity over a certain image capture range (distance and area), uses sensors to receive the light reflected within this image capture range, converts the light into electrical signals, and outputs captured image signals.

As such an image capture device, in the prior art, a configuration has been proposed in which an image capture unit is positioned in the center, and a plurality of light-emitting elements (point-light source elements) are arranged on the periphery thereof (see for example WO2004/088588 (FIG. 1 and FIG. 6)). In this proposal, each of the point-light source elements is responsible for irradiation of a prescribed image-capture range, and so the point-light source elements are positioned on the periphery of and at a distance from the image capture unit, and moreover in order to provide light of prescribed uniform intensity to the image capture range, are positioned in closer proximity to the subject than the image capture unit.

In this image capture device of the prior art, as stated above, the point-light source elements are positioned at a distance, so that the device cannot easily be made compact, and there are limits to incorporation in other equipment. Further, greater compactness results in difficulty of assembly, and the rate of occurrence of defects is high. For these reasons, it has been difficult to realize an image capture device which is small in size and inexpensive.

SUMMARY OF THE INVENTION

Hence an object of the invention is to provide an image capture device which has a small-size configuration, and performs spread illumination of a subject when performing image capture, and which can easily be assembled.

A further object of the invention is to provide an image capture device which has a small-size configuration, provides broad illumination of a subject to perform image capture, and for which the rate of occurrence of defect products is reduced.

Still a further object of the invention is to provide an image capture device which has a small-size configuration, provides broad illumination of a subject to perform image capture, and prevents the intrusion of unnecessary light into the image capture unit.

In order to attain these objects, an image capture device of this invention, which illuminates a subject, receives light reflected from the subject, and captures an image of the subject, has an image sensor, which receives reflected light; a plurality of light-emitting elements, mounted in positions on the periphery of the image sensor; a light-guiding member, which guides light from the plurality of light-emitting elements to the image capture range and illuminates the image capture range; an optical unit, accommodated within the light-guiding member, to guide light reflected by a subject within the illuminated image capture range to the image sensor; an optical filter, provided on the subject side of the optical unit and light-guiding member, and installed in a case; and a hood for blocking light outside the image capture range of the optical unit. A plurality of protrusions are provided on the light-guiding member, a slit is provided in the lower portion of the hood, the protrusions of the light-guiding member are pressed by the lower end of the hood, and moreover the upper end of the hood is pressed by the optical filter installed in the case.

In this invention, it is preferable that a positioning rib, which positions the hood at the protrusions, be provided at a position corresponding to the slit at the lower portion of the hood.

In this invention, it is preferable that at the lower end of the hood a plurality of slits be provided and a plurality of positioning ribs be provided.

In this invention, it is preferable that a pair of positioning ribs be provided at the lower end of the hood, so as to sandwich the protrusions of the light-guiding member.

In this invention, it is preferable that a plurality of slits, and a plurality of positioning ribs, be provided at the lower portion of the hood, corresponding to the plurality of protrusions of the light-guiding member.

In this invention, it is preferable that the plurality of protrusions be provided at different positions in the circumferential direction on the inner face of the light-guiding member, and that the plurality of slits and the plurality of positioning ribs be provided on the lower portion of the hood, corresponding to the plurality of protrusions.

In this invention, it is preferable that a positioning rib which positions the hood at the protrusions be provided at a position corresponding to the center of the slits on the lower end of the hood.

In this invention, it is preferable that the hood has a pressing portion which supports the optical unit, a hood outer wall which blocks light outside the image capture range, a slit provided in the outer wall lower portion, and the positioning ribs which press the protrusions of the light-guiding member.

In this invention, it is preferable that the hood has a flange, provided in the hood upper portion.

In this invention, it is preferable that there be provided a circuit board, on which are mounted the image sensor, the plurality of light-emitting elements, and a light-emitting element for distance measurement; an aperture which is mounted on the circuit board and concentrates light emitted by the light-emitting element for distance measurement in a spot to irradiate the subject; and a supporting block which is provided on a portion of the aperture, and supports a portion of the lower end of the light-guiding member.

In this invention, it is preferable that the light-guiding member have a lower-end portion for taking in light from the light-emitting elements, an upper-end portion for emitting light to the image-capture range, and a light-guiding portion for guiding light from the light-emitting elements from the lower-end portion to the upper-end portion.

In this invention, it is preferable that the plurality of light-emitting elements be mounted on the circuit board along a circle peripheral to the image sensor at prescribed intervals, and that the light-guiding member be configured in a ring shape corresponding to this circle.

In this invention, it is preferable that there further be provided a diffusing/polarizing plate, which is provided between the light-guiding member and the plurality of light-emitting elements, and diffuses and polarizes light from the light-emitting elements, and a mounting base, which is provided on the circuit board, and on which the diffusing/polarizing plate is mounted.

In this invention, it is preferable that the light-emitting element for distance measurement be mounted on the circuit board, in a position outside the light-emitting elements.

In this invention, it is preferable that the plurality of light-emitting elements be light-emitting elements which emit infrared light, and that the optical filter be an optical filter which filters visible light.

Further, in this invention it is preferable that the light-emitting element for distance measurement has four light-emitting elements, and be mounted on the circuit board at positions outside the light-emitting elements, in a diagonal relation.

Further, in this invention it is preferable that there be further provided a control board, connected to the circuit board, for connection to external equipment, as well as a slot, provided in a holder assembly, to support the control board.

Further, it is preferable that the image sensor capture images of a human body portion.

In this invention, a slit is provided at the lower end of the hood, so that a visible light filter can be installed in the hood, the visible light filter can be fixed to the outer case to eliminate a bonding process, and the occurrence of a gap between the hood and the visible light filter due to a spring action of the slit upon assembly can be prevented. Hence intrusion of light other than light irradiating the image capture range from a gap into the optical unit 34 can be prevented, external light can be blocked, and capture of distinct images is possible.

BRIEF DESCRIPTION OF THE DRAWINGS

FIG. 13 explains the spring action of the hood of FIG. 11;

FIG. 14 is an assembly diagram of the hood and light-guiding member of FIG. 10; and, FIG. 15 explains operation of the flange of the hood of FIG. 10.

DESCRIPTION OF THE PREFERRED EMBODIMENTS

Below, embodiments of the invention are explained in the order of the configuration of an image capture device, an illumination mechanism, a hood configuration, and other embodiments.

Image Capture Device

Figure 1:
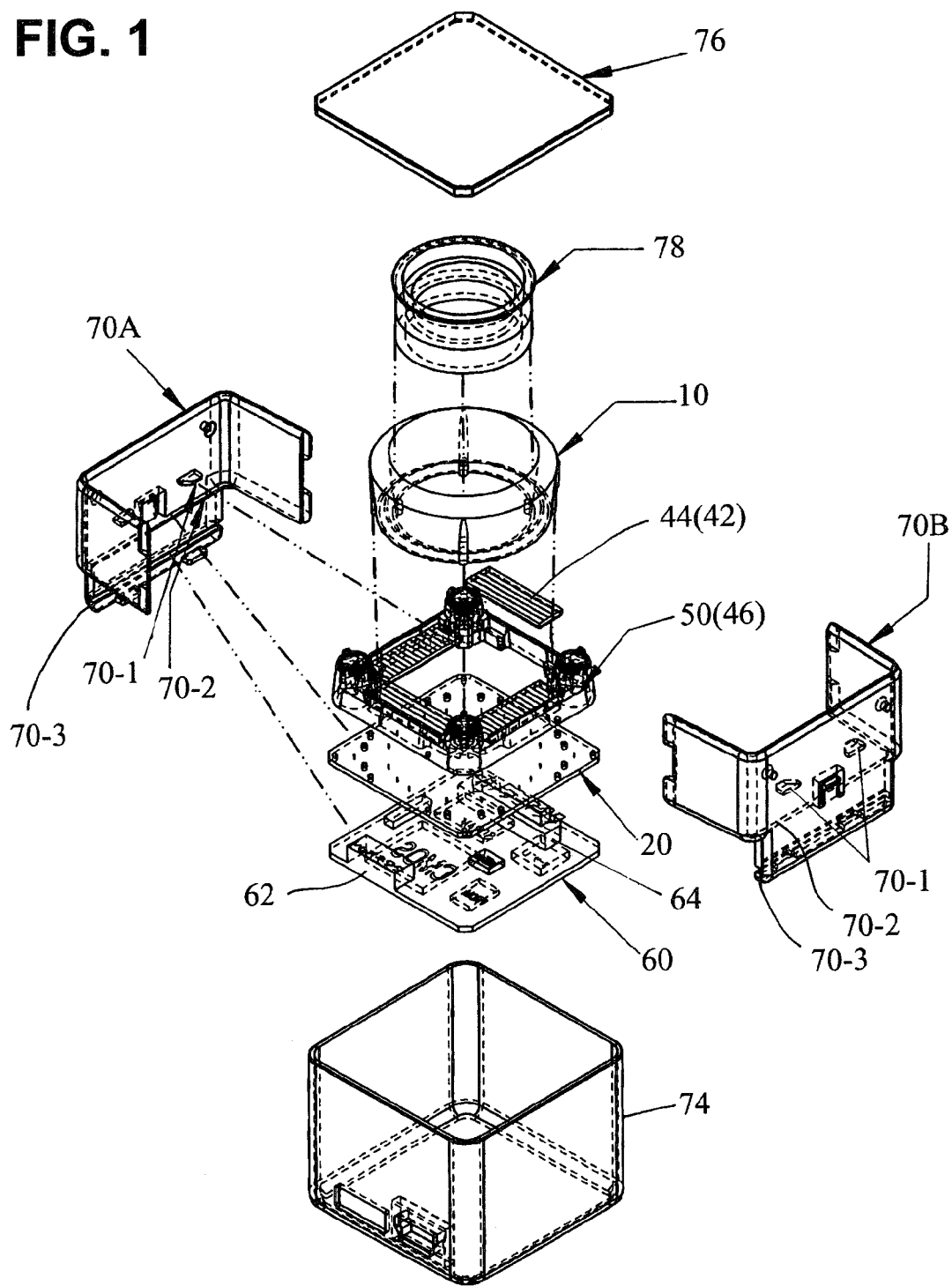
FIG. 1 is an exploded configuration view of the image capture device of one embodiment of the invention.
Figure 2:
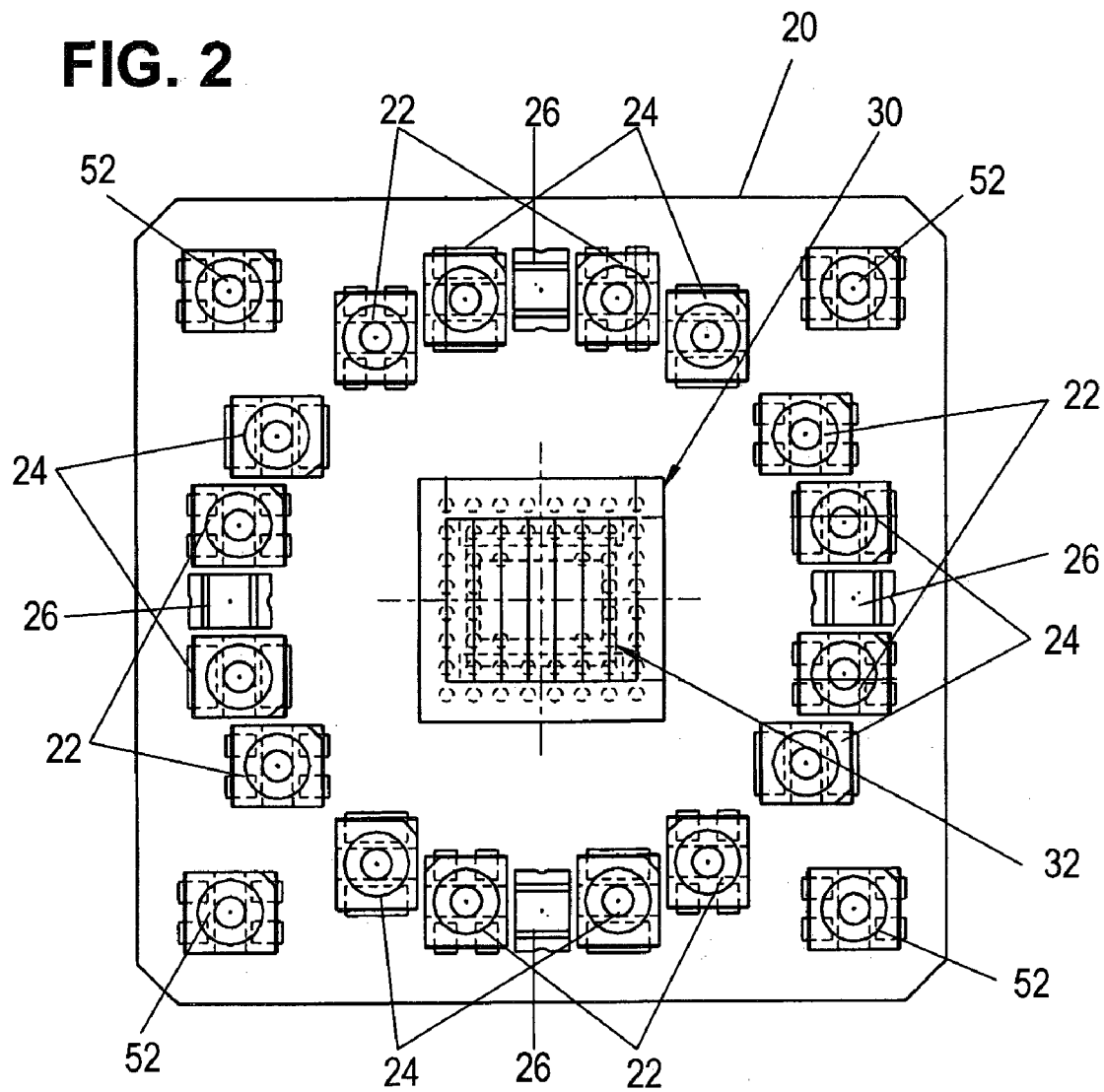
FIG. 2 shows the arrangement of components on the circuit board of FIG. 1.
Figure 3:
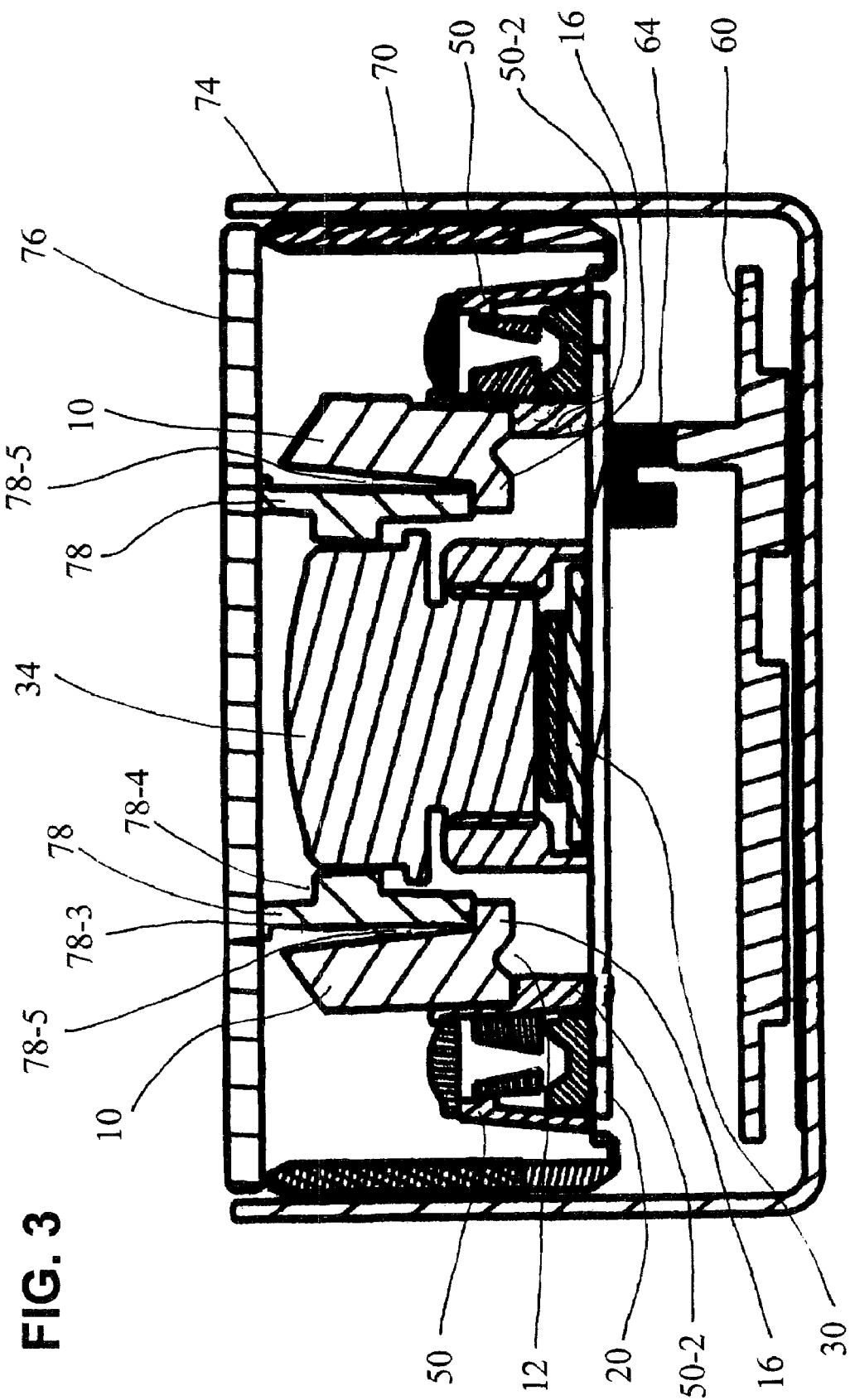
FIG. 3 is a cross-sectional view of the image capture device of FIG. 1.

FIG. 1 is an exploded configuration diagram of the image capture device of one embodiment of the invention, FIG. 2 is a top view of the board in FIG. 1, and FIG. 3 is a cross-sectional view of the image capture device of FIG. 1.

As shown in FIG. 1, a camera board 20 and control board 60 are provided. As shown in FIG. 2, a CMOS image sensor or other image sensor 30 and a polarizing plate 32 are provided at the center of the camera board 20. On the periphery of the image sensor 30 on the camera board 20 are mounted a plurality of light-emitting elements 22, 24 and a plurality of light-receiving elements 26.

That is, an image sensor 30 is mounted at the center of the camera board 20, and a polarizing plate 32 is affixed thereupon. A plurality of light-emitting elements 22, 24 and a plurality of light-receiving elements 26 are mounted along a circle on the periphery of the image sensor 30 on the camera board 20. In this embodiment, two each of first light-emitting elements (LEDs) 22 which emit light at a first wavelength and of second light-emitting elements (LEDs) 24 which emit light at a second wavelength, are provided for each edge of the image sensor 30. That is, eight each first light-emitting elements (LEDs) 22 and second light-emitting elements (LEDs) 24 are provided on the periphery of the image sensor 30.

Between the first light-emitting elements 22 and second light-emitting elements 24 are provided light-receiving elements (photodiodes) 26. These light-receiving elements 26 receive light from the first light-emitting elements 22 and second light-emitting elements 24 (light reflected from the polarizing plate 44, described below), and are provided in order to perform APC (automatic power control) of the first light-emitting elements 22 and second light-emitting elements 24.

For example, the first light-emitting elements 22 emit near-infrared light of a first wavelength, and the second light-emitting elements 24 emit light of a wavelength different from this. The light emission by the first light-emitting elements 22 and second light-emitting elements 24 is driven with individual timing. Using two images captured using the illumination of both light-emitting element types 22 and 24 with different wavelengths, recognition of the pattern which is the target object (here, blood vessel images) is facilitated.

In this example, in order to perform automatic power control of each of the first and second light-emitting elements 22, 24 emitting light with individual timing, the single light-receiving elements 26 are positioned between the first and second light-emitting elements 22, 24 such that light from the first and second light-emitting elements 22, 24 is received. For this reason, the number of light-receiving elements for APC control can be reduced.

Returning to FIG. 2, four (third) light-emitting elements for distance measurement 52 are further provided, to measure the distance to the subject, in the four corners of the camera board 20. These four light-emitting elements for distance measurement 52 are positioned in diagonal lines of the camera board 20, and the intervals between light-emitting elements 52 are positioned on the most distant diagonal lines. The inclination of the subject (here, the palm of a hand) is detected from the distances measured by these four third light-emitting elements for distance measurement 52.

That is, illumination systems 22, 24 and 26 used to capture images of subjects, and image capture systems 30 and 32, are provided in one camera board 20, and in addition a distance measurement system 52 is also provided.

Returning to FIG. 1, four diffusing plates 44 and four polarizing plates 42 are provided above the light-emitting elements 22, 24 of the camera board 20. These diffusing plates 44 and polarizing plates 42 are affixed to a polarization/diffusion base 46 installed at the four corners of the camera board 20. The diffusing plates 44 diffuse, to some extent, the directional light emission distribution of the first and second light-emitting elements 22, 24. The polarizing plates 42 convert the natural light of the first and second light-emitting elements 22, 24 into linearly polarized light.

A ring-shape light-guiding member 10 is provided above the four polarizing plates 42. The light-guiding member 10 is for example formed from a resin, and guides light from the first and second light-emitting elements 22, 24 of the camera board 20 upward, to irradiate the subject with uniform light. To this end, the light-guiding member 10 has a ring shape, in accordance with the placement of the light-emitting elements 22, 24 on the camera board 20. This light-guiding member 10 irradiates the subject with uniform light while guiding the light of the first and second light-emitting elements 22, 24 upward, as explained using FIG. 4 and followings.

Further, an optical unit 34 (explained below using FIG. 3) is installed on the camera board 20, above the image sensor 30 substantially in the center of the camera board 20 and within the ring-shape light-guiding member 10. The optical unit 34 comprises a condensing lens or other lens-based optical system.

Apertures 50 are installed in the light-emitting elements for distance measurement 52 on the camera board 20. The apertures 50 block the diffusion of light in other directions, such that light from the light-emitting elements for distance measurement 52 is directed toward the subject.

Separately from the camera board 20, a control board 60 is provided. The control board 60 is provided for connection with external equipment, and has an external connector 62 and a camera connector 64 for connection with the camera board 20. This control board 60 is provided below the camera board 20, and is electrically connected with the camera board 20 by the camera connector 64.

Further, as shown in FIG. 1, a visible light cutoff filter plate 76, hood 78, holder assemblies 70A and 70B, and outer case 74 are prepared. The visible light cutoff filter plate 76 cuts out visible light components entering the image sensor 30 from the outside. The hood 78 prevents the intrusion into the optical unit 34 of light leaking from the light-guiding member 10, as well as stopping the intrusion in to the optical unit 34 of light outside the prescribed image capture range, as explained below using FIG. 10.

As explained above, an image sensor 30, light-emitting elements 22 and 24, light-receiving elements 26, and light-emitting elements for distance measurement 52 are mounted on the camera board 20. That is, the basic configurations of an illumination system and an image capture system are mounted on a single board. For this reason, a single mounting board is used, contributing to reduced costs.

Above the light-emitting elements 22, 24, the ring-shape light-guiding member 10 is provided, and guides the light of the light-emitting elements 22, 24 to the visible light filter 76. This light-guiding member 10 separates the light of the light-emitting elements 22, 24, and emits the light at the visible light filter 76. Hence even when the light-emitting elements 22, 24 are provided in proximity to the image sensor 30, the elements can be provided on the same board 20 for greater compactness, and the subject can be illuminated with uniform light.

Further, the light-guiding plate 10 is ring-shape, so that the optical unit 34 can be accommodated within the ring 10, for still greater compactness. Also, the hood 78 prevents the entrance into the optical unit 34 of light from outside the prescribed image capture range, and prevents light which has leaked from the light-guiding member 10 from intruding into the optical unit 34. Consequently declines in image capture precision can be prevented even when the light-guiding member 10 and light-emitting elements 22, 24 are provided in proximity to the image sensor 30 and optical unit 34.

Furthermore, the light-emitting elements for distance measurement 52 are further provided on the camera board 20, so that the camera unit for distance measurement can be made still more compact. The control board 60 is connected to the lower portion of the camera board 20, and an external cable is connected to the external connector 62 of the control board 60.

The image sensor 30, light-emitting elements 22, 24, light-receiving elements 26, and light-emitting elements for distance measurement 52 are mounted on the camera board 20, and this camera board 20, the diffusion/polarization base 46, diffusion plate 44, polarizing plate 42, aperture 50, optical unit 34, light-guiding member 10, hood 78, and control board 60, are installed in the holder assemblies 70A, 70B to assemble the camera portion.

Further, as shown in FIG. 1, the pair of holder assemblies 70A, 70B each has a slot 70-3 in the lower portion for insertion of the control board 60, a supporting portion 70-2 in the center to support the camera board 20, and a protrusion 70-1 above the supporting portion 70-2 to sandwich the diffusion/polarization base 46.

As shown in FIG. 3, the light-guiding member 10 has a protruding block 16 in proximity to the lower groove portion 12, and the hood 78 has a pressing portion 78-4, hood outer wall 78-1, flange 78-3 provided in the upper portion of the hood outer wall 78-1, and lower pressing block 78-5.

Assembly of this configuration is explained referring to FIG. 1 and FIG. 3. The feet of the apertures 50 are inserted into the camera board 20, on which are mounted the image sensor 30, light-emitting elements 22, 24, light-receiving elements 26, and light-emitting elements 52 for distance measurement, shown in FIG. 2, to install the integrated diffusion/polarization base 46 and apertures 50. On this diffusion/polarization base 46, the diffusion plate 44 and polarizing plate 42 have been installed in advance by bonding or similar means.

Next, the control board 60 is connected by a connector to the camera board 20, and the holder assemblies 70A, 70B are installed from both sides onto this assembly. At this time, as shown in FIG. 1, the control board 60 is inserted into the slots 70-2 in the pair of holder assemblies 70A and 70B, the camera board 20 is installed on the supporting portions 70-2, and the diffusion/polarization base 46 is installed so as to be enclosed between the protrusions 70-1.

Next, after inserting this assembly into the case 74, the optical unit 34 is set on the camera board 20, and the light-guiding member 10 is installed so that the lower portion of the light-guiding member 10 sits on the supporting block 50-2 of the aperture 50 (see FIG. 3).

The hood 78 is then installed such that the lower block 78-5 sits on the protruding block 16 of the light-guiding member 10, and finally, the visible light cutoff filter plate 76 is bonded to a side face of the case 74.

In this way, supporting portions 70-2, 70-3 for the boards 20 and 60 are provided on the holder assemblies 70A, 70B which form side members, to support the boards 20 and 60, and moreover the aperture 50 of the distance sensor, light-guiding member 10, and hood 78 are configured so as to latch each other, and are pressed by the uppermost visible light cutoff filter plate 76. By this means the number of places for bonding is greatly reduced, and in particular there are fewer processes of applying an adhesive and bonding within the case 74.

Hence a compact image capture device 1, such as for example an image capture device measuring approximately 3.5 cm×3.5 cm in height and width, can be assembled with hardly any bonding processes. Bonding processes may result in defects in the product itself if adhesive is applied in unnecessary areas, and moreover approximately one hour is required for adhesive to dry, so that workability is poor.

Further, if different types of adhesive are required for different components, compatibility problems arise, and there are limits to the types of adhesive which may be used. Hence the ability to perform assembly without bonding processes is advantageous for preventing the occurrence of defects and for improving workability.

Illumination Mechanism

Figure 4:
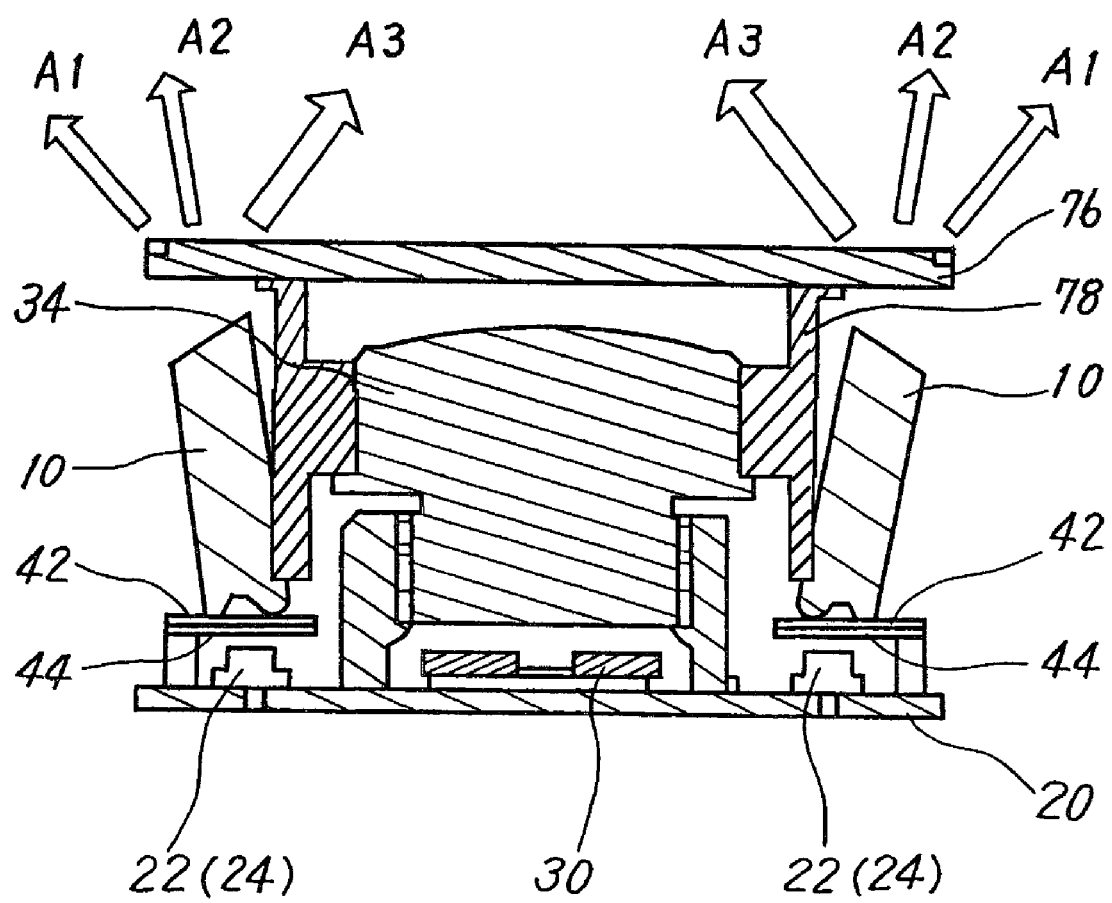
FIG. 4 explains the illumination system of FIG. 1 and FIG. 3.

Next, an illumination mechanism comprising a light-guiding member is explained. FIG. 4 is a diagram explaining operation of the light-guiding member in one embodiment of the invention, FIG. 5 explains the detailed configuration of the illumination mechanism of FIG. 4, FIG. 6 explains the base-shape cutout portion of the light-guiding member of FIG. 5, and FIG. 7 through FIG. 9 explain light-guiding operation and diffusing operation of the light-guiding member of FIG. 5. In the following figures, the shape of the light-guiding member is simplified for simplicity of explanation.

In FIG. 4, portions which are the same as in FIG. 1 and FIG. 3 are assigned the same symbols. As shown in FIG. 4, the light-guiding member 10 guides light from the light-emitting elements 22, 24, which are point light sources, to the visible light filter 76 so as to divide the light into three portions.

That is, in essence, light A3 in the direction of the optical unit 34, light A2 in the length direction of the light-guiding member 10, and light A1 in the direction opposite the optical unit 34, are emitted from the light-guiding member 10. By providing this light-guiding member 10, a single point light source 22 or 24 can behave as though the light source were three point light sources in the vicinity of the visible light filter 76.

Figure 5:
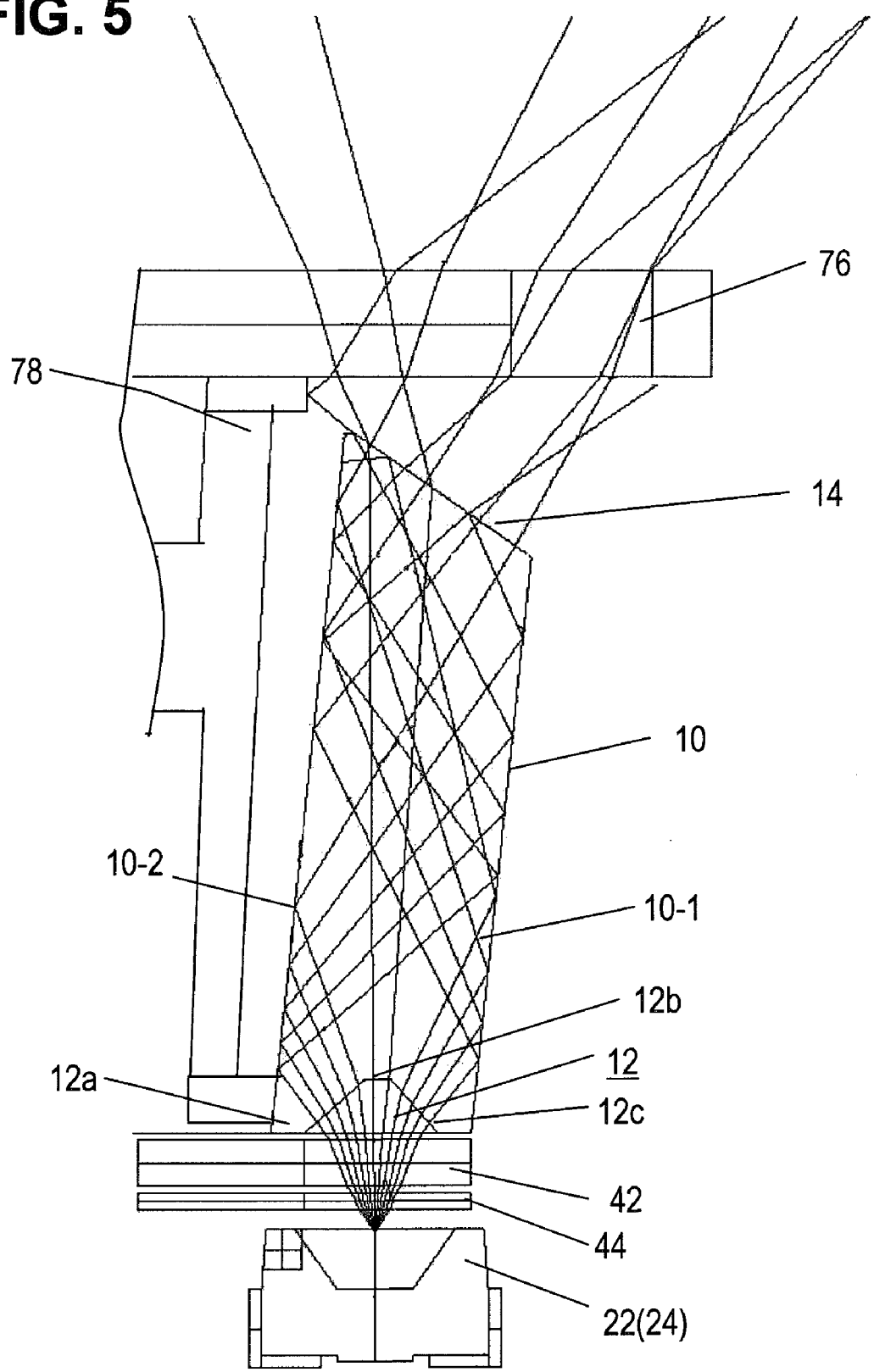
FIG. 5 shows the configuration of the light-guiding member and light-emitting elements of FIG. 1 through FIG. 4.

As shown in FIG. 5, the light-guiding member 10 comprises an upper inclined face 14, two side faces 10-1 and 10-2, and a lower trapezoidal groove portion 12. The lower trapezoidal groove portion 12 opposes the light-emitting elements 22, 24 with the polarizing plate 42 and diffusing plate 44 intervening, to receive light from the light-emitting elements 22, 24. The upper inclined face 14 is an inclined face which is higher on the side of the optical unit 34.

Figure 6:
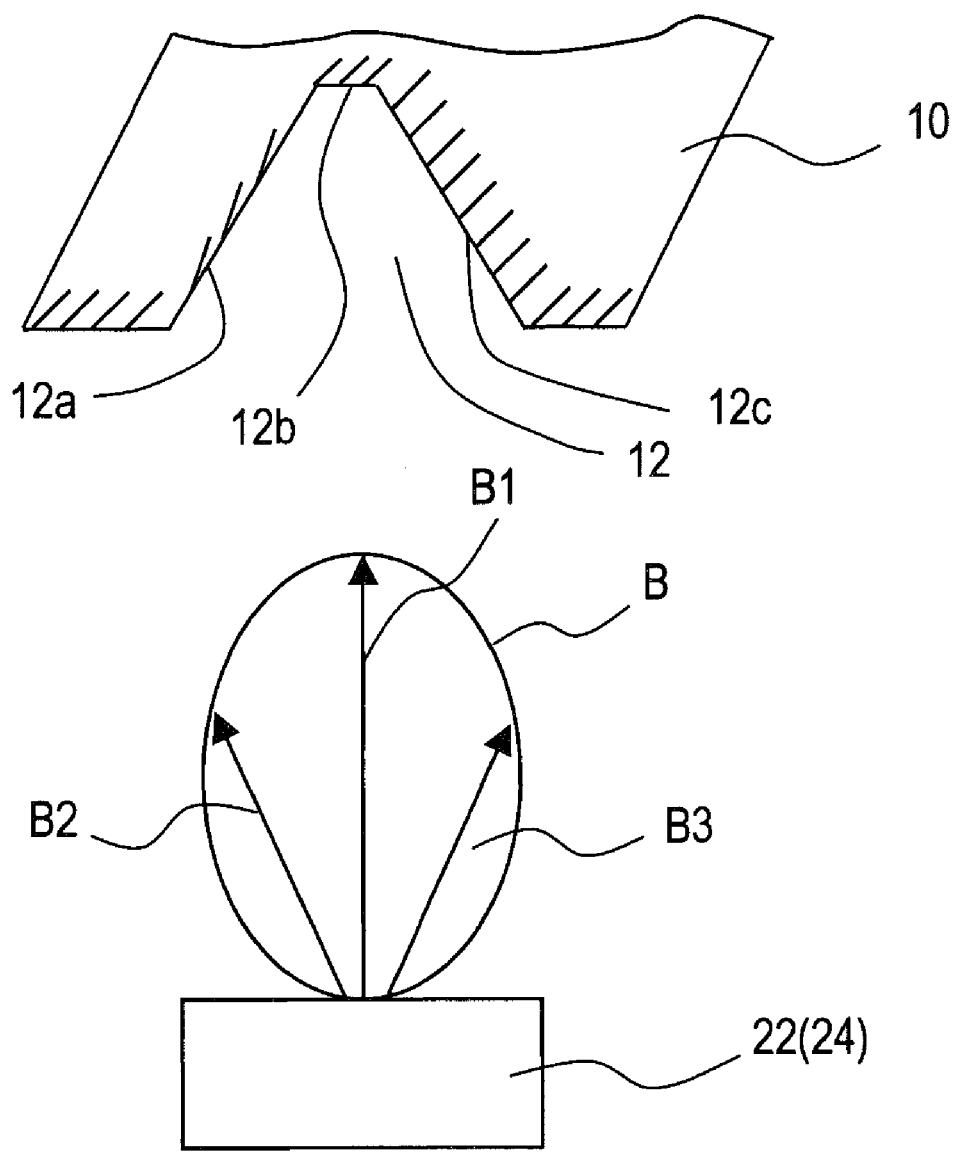
FIG. 6 shows the relation between the emitted optical intensity distribution of the light-emitting element of FIG. 5 and the lower-end portion of the light-guiding member.

As shown in FIG. 6, the emitted optical intensity distribution B from the light-emitting elements 22, 24 describes a circular arc shape which is long (more intense) in the upward direction. That is, the intensity of the light component B1 in the light emission direction of the light-emitting elements 22, 24 (direction perpendicular to the elements) is higher than the intensity of the light components B2, B3 in the lateral directions. The trapezoidal groove 12 of the light-guiding member 10 is formed corresponding to this intensity distribution B, such that on the emission side, as shown in FIG. 4, a point light source can be regarded as three point light sources.

That is, the trapezoidal groove 12 comprises a flat portion 12b which takes in the light component B1, and a pair of inclined face portions 12a, 12c inclined according to the directions of the light components B2 and B3 so as to take in the light components B2 and B3 on both sides, so that as a result of reflections within the light-guiding member 10, a point light source appears as three point light sources. Due to the shape of this trapezoidal groove 12, the light from each of the point light sources 22, 24 acts as if divided into three.

Further, as explained below, the lengths of the flat portion 12b and the inclined face portions 12a, 12c are set such that the optical intensity in a prescribed area is substantially uniform as a result of the light emitted from the light-guiding member 10. Here, the length of the flat portion 12b, which receives the light component B1 with the highest optical intensity, is shorter than the lengths of the inclined face portions 12a, 12c which receive the light components B2 and B3 with lower optical intensities. By this means, the light quantities divided can be adjusted according to the optical intensity distribution.

Figure 7:
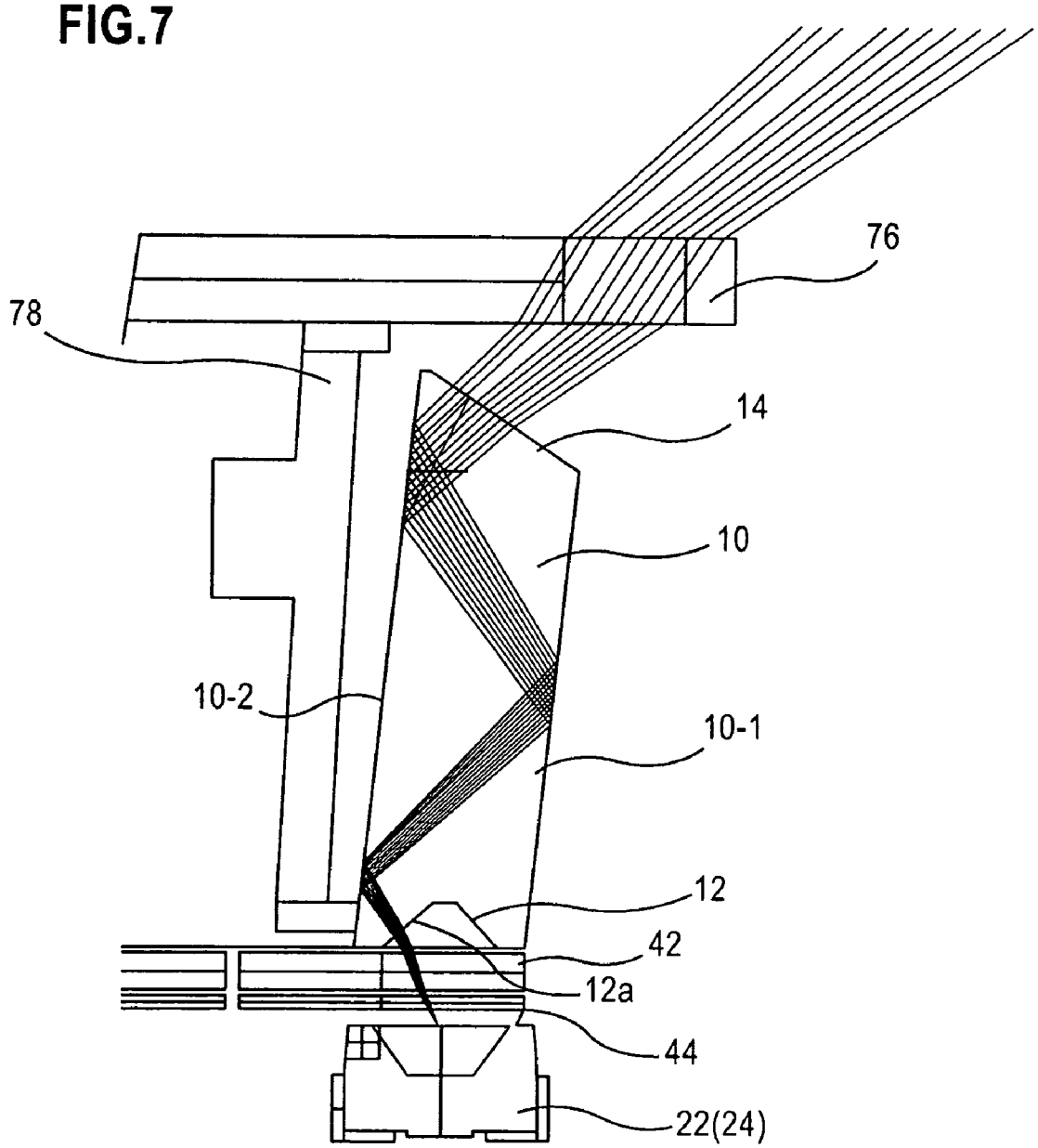
FIG. 7 explains a first operation of the light-guiding member of FIG. 5.
Figure 8:
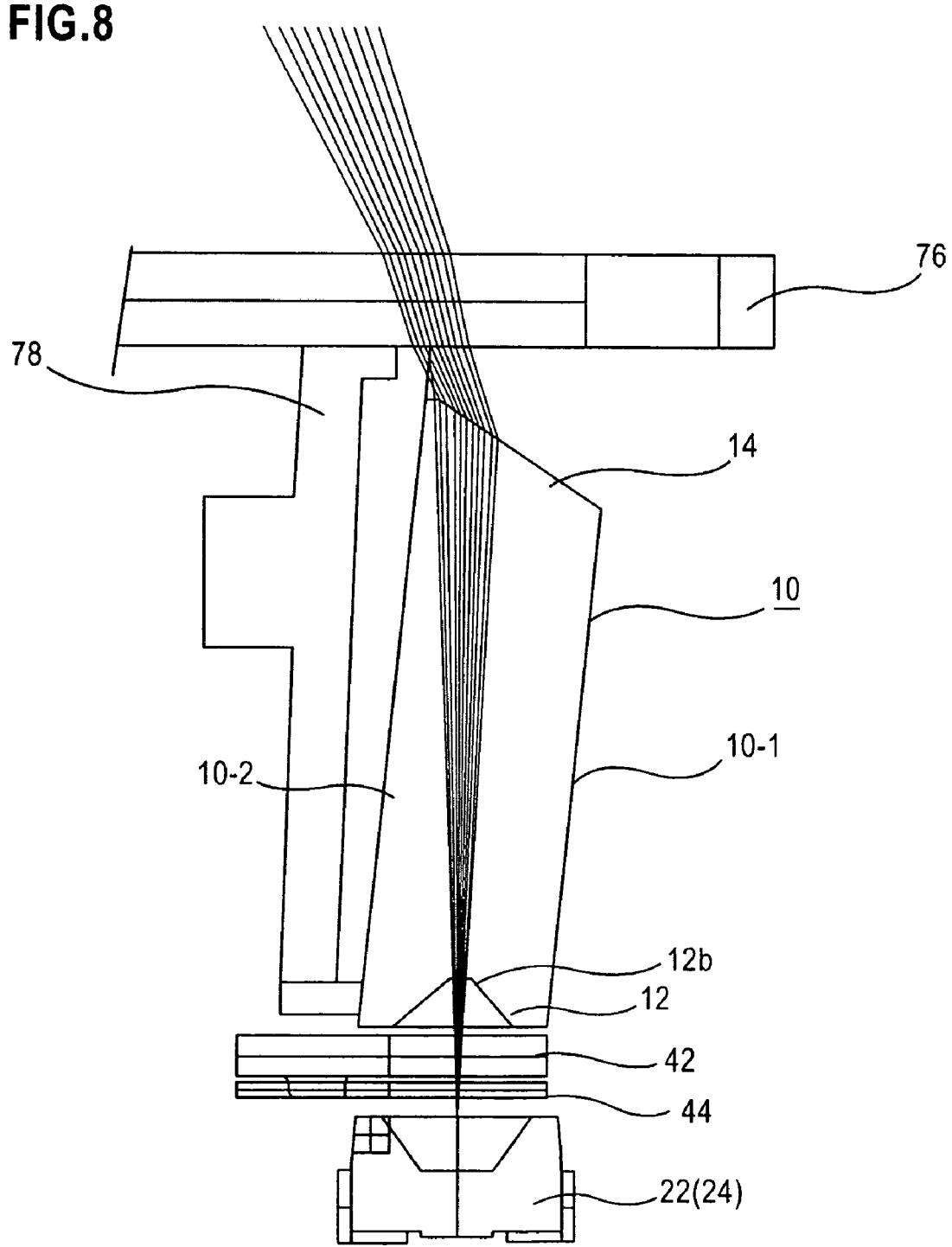
FIG. 8 explains a second operation of the light-guiding member of FIG. 5.
Figure 9:
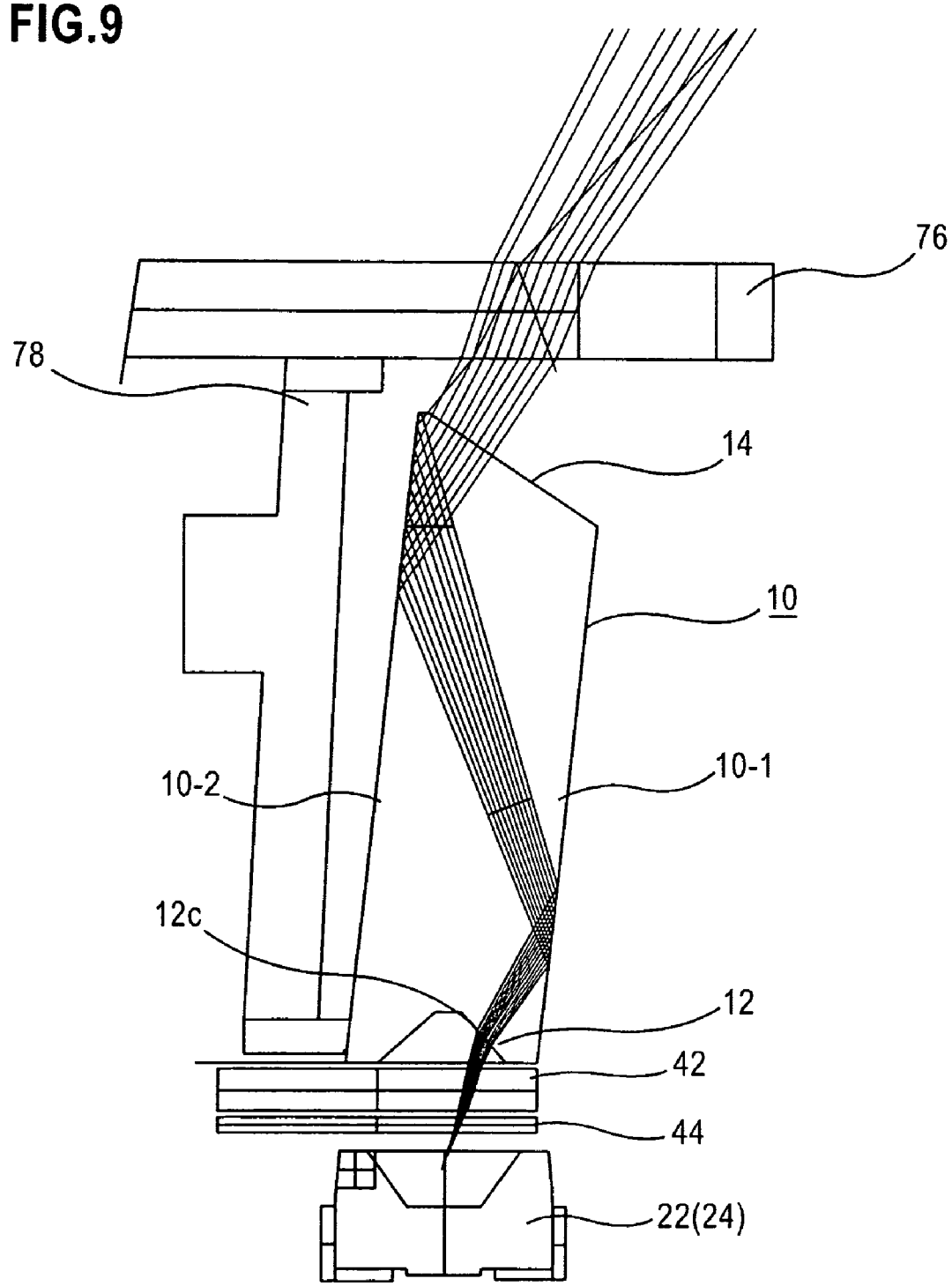
FIG. 9 explains a third operation of the light-guiding member of FIG. 5.

This operation is explained using FIG. 7 through FIG. 9. As shown in FIG. 7, the component B2 on the left side of the optical intensity distribution B of the light-emitting elements 22, 24 is incident on the left face 10-2 of the light-guiding member 10 from the left inclined face portion 12a of the light-guiding member 10, is reflected by the left face 10-2, and propagates toward the right face 10-1 of the light-guiding member 10. And, the light propagating toward the right face 10-1 is reflected by the right face 10-1, again propagates toward the left face 10-2, is reflected by the left face 10-2, is incident substantially perpendicularly on the inclined face 14, and is emitted to the outermost portion of the image capture range.

As shown in FIG. 8, the component B1 in the center of the emission optical intensity distribution B of the light-emitting elements 22, 24 is incident on the light-guiding member 10 from the center flat portion 12b of the light-guiding member 10, is obliquely incident on the upper inclined face 14, and is emitted to the innermost portion of the image capture range.

Further, as shown in FIG. 9, the component B3 on the right side of the emission optical intensity distribution B of the light-emitting elements 22, 24 is incident on the right face 10-1 of the light-guiding member 10 from the right inclined face portion 12c of the light-guiding member 10, is reflected by the right face 10-1, and propagates toward the left face 10-2 of the light-guiding member 10. Light propagating toward the left face 10-2 is reflected by the left face 10-2, is incident substantially perpendicularly on the upper inclined face 14, and is emitted in a direction between the innermost portion and the outermost portion of the image capture range.

Combining FIG. 7 through FIG. 9, an optical path diagram such as that of FIG. 5 is obtained. That is, the light-guiding member 10 divides point emission light from the point light sources 22 and 24 into three light beams by means of the trapezoidal groove portion 12, and utilizing the reflections by inner surfaces in the light-guiding member 10, each of the light components is emitted so as to behave, on the emission side of the light-guiding member 10, as if there exist three point light sources.

In this case, the upper inclined face 14 of the light-guiding member 10 is used to adjust the emission directions, taking into consideration the image capture range of the optical unit 34 and the image sensor 30. Further, in order to obtain a substantially uniform optical intensity in the image capture range, the lengths of the flat portion 12b and inclined face portions 12a and 12c of the trapezoidal groove portion 12 of the light-guiding member 10, that is, the incidence widths and incident amounts, are adjusted taking into consideration the emission optical intensity distribution B of the light-emitting elements 22, 24 explained using FIG. 6.

Here, because the emission optical intensity distribution B of the light-emitting elements 22, 24 explained in FIG. 6 is high in the center and low on the periphery, in order to obtain a substantially uniform optical intensity, the length of the flat portion 12b of the trapezoidal groove portion 12 of the light-guiding member 10 is made shorter than the lengths of the inclined face portions 12a and 12c, so that the portion of high optical intensity is incident not only on the flat portion 12b, but also on the inclined face portions 12a and 12c.

Utilizing the trapezoid-shape groove 12 and upper inclined face 14 of the light-guiding member 10 and reflections by the light-guiding member 10, reflected light and rectilinear light can be diffused and emitted such that substantially uniform optical intensity is obtained in the image capture range. That is, the image capture range of the image sensor 30 can be irradiated with light of substantially uniform optical intensity.

Hood Configuration

Figure 10:
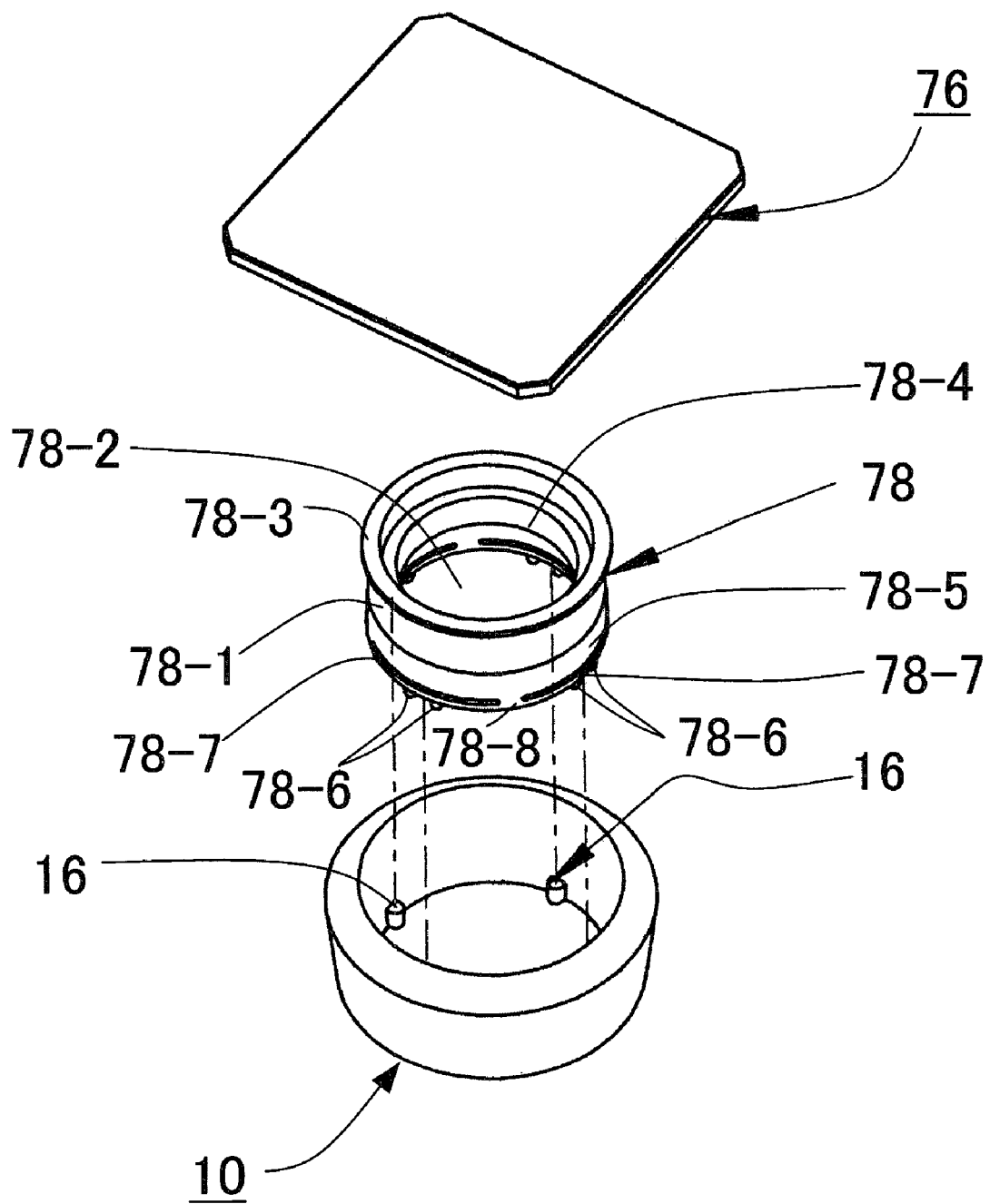
FIG. 10 is a perspective view of the hood and light-guiding member of FIG. 1 and FIG. 3.
Figure 11:
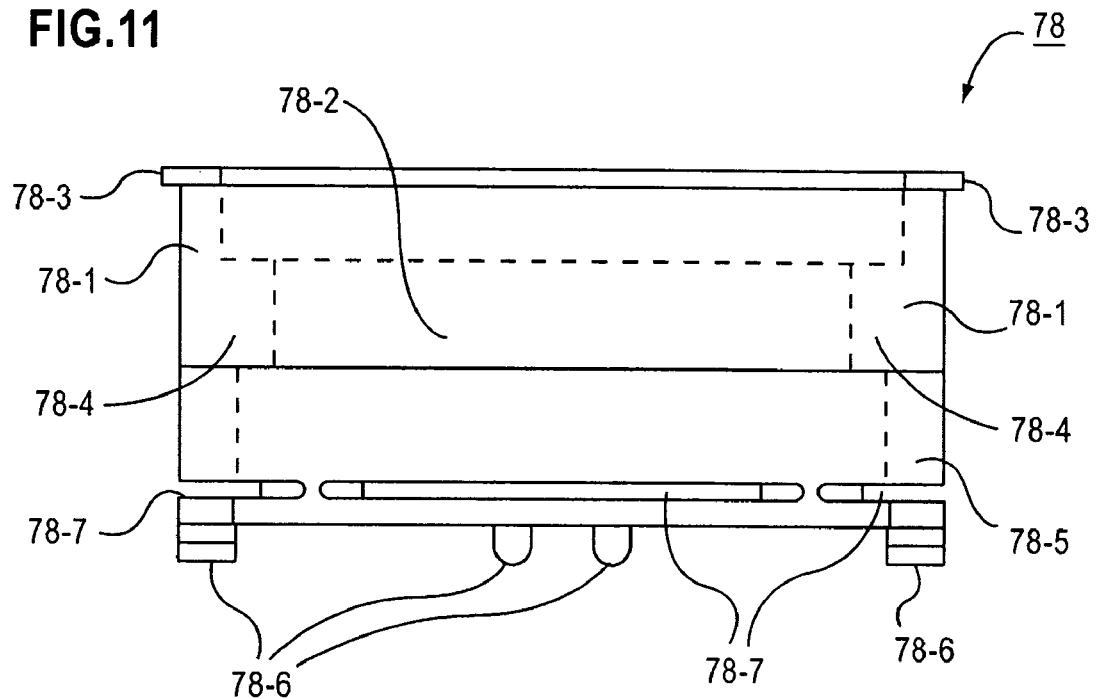
FIG. 11 is a cross-sectional view of the hood of FIG. 10.
Figure 12:
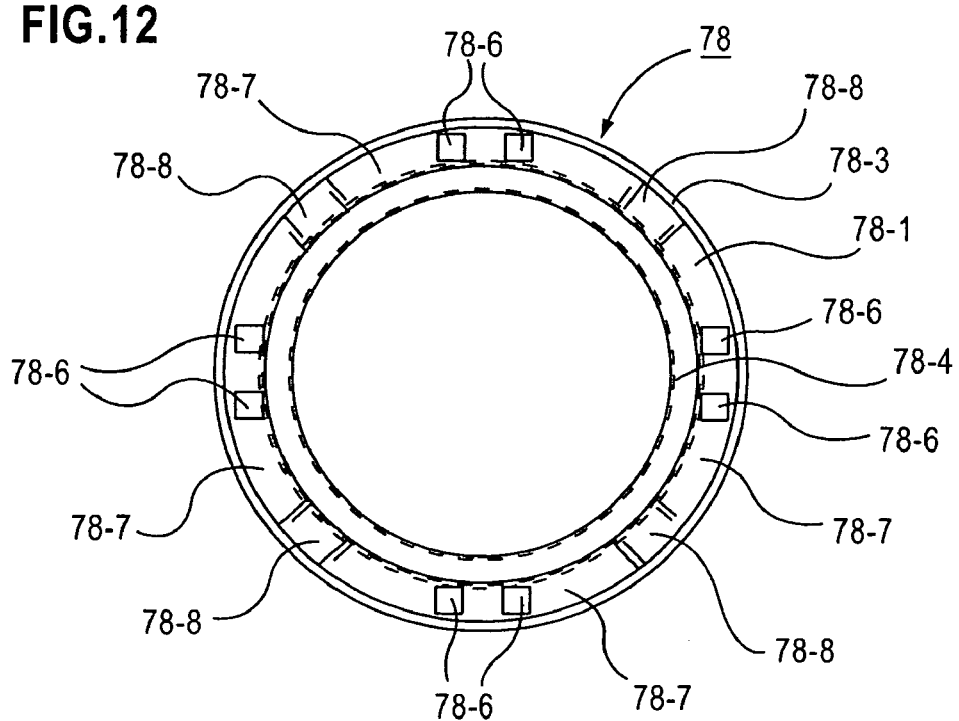
FIG. 12 is a top view of the hood of FIG. 10.

FIG. 10 is a perspective view of the hood 78, FIG. 11 is a cross-sectional view of the hood, and FIG. 12 is a top view of the hood. As shown in FIG. 10 through FIG. 12, the hood 78 has a hood outer wall 78-1, a retraining portion 78-4 for the hood outer wall 78-1, exposure opening 78-2, a flange 78-3 provided in the uppermost portion of the hood outer wall 78-1, and lower block 78-5, explained using FIG. 3.

Further, a bottom portion 78-8, in which are provided a plurality of (here, three) slits 78-7 extending in a horizontal direction, is provided on the lower block 78-5. A plurality of positioning ribs 78-6 are provided in this bottom portion 78-8. The positioning ribs 78-6 are provided in pairs, corresponding to the center positions of slits 78-7.

While, on the light-guiding member, a plurality of (here, three) protruding blocks 16 in a protruding shape are provided, at equal intervals on the inner periphery of the lowermost face of the light-guiding member 10. As explained above using FIG. 3, these three protruding blocks 16 support the bottom portion 78-5 of the hood 78.

Next, operation of this hood is explained. FIG. 13 explains the operation of slits in the hood 78, FIG. 14 is a cross-sectional view of installation of the hood 78, and FIG. 15 explains operation of the hood 78.

As shown in FIG. 3 and FIG. 14, the exposure opening 78-2 of the hood 78 sets the optical unit 34, and the pressing portion 78-4 of the hood 78 supports the optical unit 34 in the circumferential direction (see FIG. 3 also).

As shown in FIG. 14, the hood 78 is inserted into the light-guiding member 10. At this time, the hood 78 is inserted into the light-guiding member 10 such that the protrusion-shape protruding blocks 16 of the light-guiding member are positioned between two positioning ribs 78-6 of the hood 78. By this means, the hood 78 is supported by the light-guiding member 10. That is, the hood 78 is supported at three points.

Further, rotation of the hood 78 can be prevented by enclosing protrusion-shape protruding blocks 16 of the light-guiding member 10 between two positioning ribs 78-6 of the hood 78. Also, as shown in FIG. 13, the positioning ribs 78-6 are provided in pairs corresponding to the center positions of the slits (grooves) 78-7, so that pressing of the protruding blocks 16 causes deformation of the slits 78-7, resulting in spring action.

As a result, as shown in FIG. 14, when the visible light filter 76 is installed in the upper portion of the hood 78 (comprising the flange 78-3), and the visible light filter 76 is fixed to the outer case 74 (see FIG. 1 and FIG. 3), the upper portion of the hood 78 becomes fixed closely to the visible light filter 76.

By this means, even when vibrations or shocks are imparted from outside, the occurrence of gaps between the hood 78 and visible light filter 76 can be prevented. If a gap were to occur, light other than the light irradiating the subject for image capture would intrude from the gap into the optical unit 34, and the external light could not be blocked, making distinct image capture difficult.

In this embodiment, through the spring action of the slits 78-7, occurrence of gaps between the hood 78 and visible light filter 76 is prevented, so that intrusion of light other than the light irradiating the subject for image capture into the optical unit 34 from a gap can be prevented, external light can be blocked, and distinct image capture can be achieved.

In particular, the hood 78 is formed from a resin, and so the slits 78-7 are advantageous for receiving vibrations and shocks due to mechanical operation of the equipment on which the image capture device is installed (for example, automated cash transaction equipment).

Further, as explained in FIG. 1 and FIG. 3, as a result of compactness, when the image capture unit 34, 30 is in proximity to the illumination mechanism 22, 10, light from the illumination mechanism which is an emission system is incident on the image capture system 34, 30, affecting the captured image. For this reason, it is necessary to optically separate the emission system and the image capture system, and so a hood 78 is provided.

This hood 78 comprises a shielding member which is opaque to light; the hood outer wall 78-1 is positioned in the direction of the light-guiding member 10. The hood outer wall 78-1, which is substantially perpendicular, blocks incidence on the image capture unit 34, 30 of light, either directly incident from the light-guiding member 10, or reflected by the lower face of the visible light filter 76. Further, the hood outer wall 78-1 limits the range of incidence of light reflected by the subject.

Figure 15:
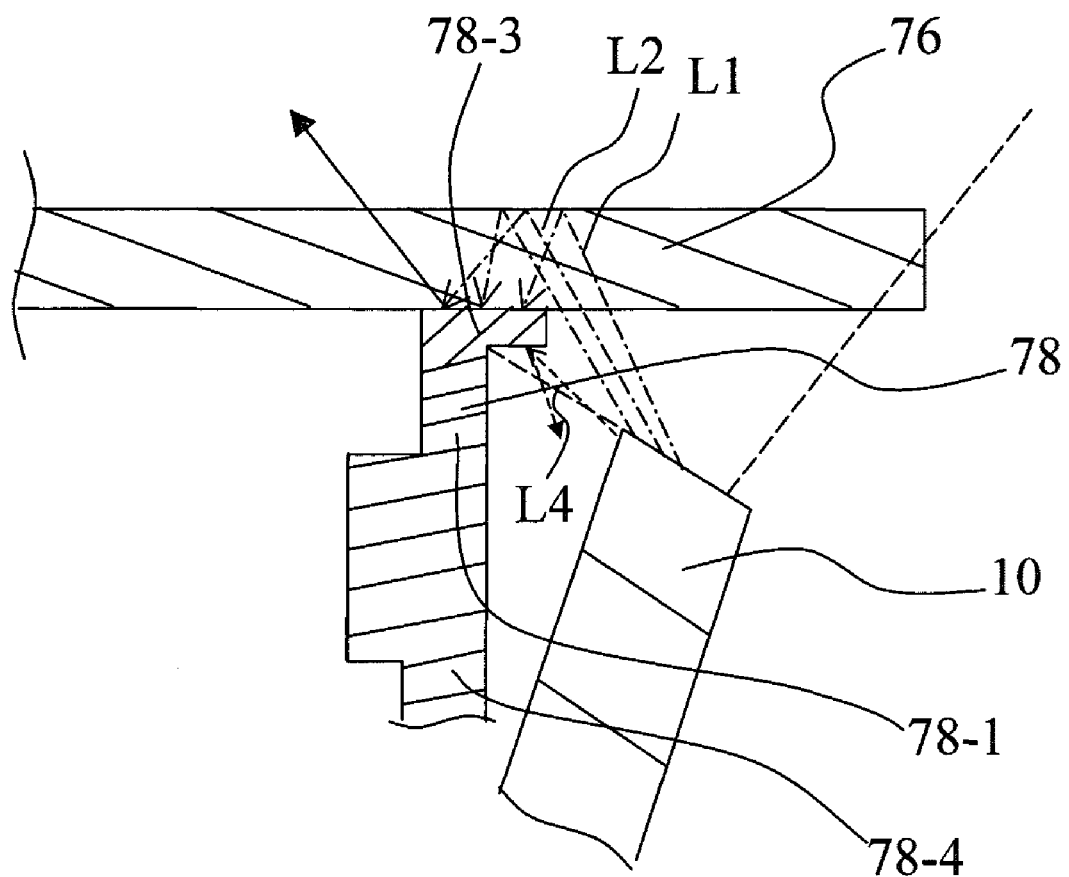

As shown in FIG. 15, the flange 78-3 provided in the upper portion of the hood outer wall 78-1 extends in the direction of the light-guiding member 10, and among the light emitted from the light-guiding member 10, blocks the incidence on the image capture unit 34, 30 of the light L1, L2, L3 reflected by the upper face of the visible light filter 76. This reflected light L1, L2, L3 is again reflected by the upper end of the hood 78 and irradiates the subject.

Light L4 emitted from the end portion of the light-guiding member 10 and stray light are blocked, to prevent incidence on the image capture unit 34, 30. Hence light-blocking by the flange 78-3 is effective for enhancing the distinctness of captured images.

In this way, the hood 78 prevents entrance into the optical unit 34 of light outside the prescribed image capture range, and prevents light not contributing to irradiation of the subject, among the light emitted from the light-guiding member 10, from intruding into the optical unit 34.

Other Embodiments

In explanations of the above-described embodiments, the subject for image capture was the palm of the hand, and image processing of captured images was used to perform authentication of the vein pattern in the palm of the hand; however, application to biometrics authentication using the characteristics of palm-prints, blood vessel images of the back of the hand, blood vessel images of the fingers, facial features, iris images, and similar is also possible; moreover, applications are not limited to biometrics authentication, and application to other areas is possible.

Further, in explanations the light-emitting elements were light-emitting elements using two wavelengths; but a single wavelength may be used. The number of light-emitting elements for distance measurement is not limited to four, and any number greater than one may be used. The minimum number of support points of the hood is three in order to prevent changes in the hood attitude (angle). However, the number of slits is not limited to three, and a greater number may be used. Similarly, if the number of slits is three or greater, attitude changes can be prevented, and gaps can be eliminated.

In the above, embodiments of the invention have been explained; but various modifications can be made within the scope of the invention, and these modifications are not excluded from the scope of the invention.

A plurality of light-emitting elements are mounted in positions on the periphery of an image sensor, and light from the plurality of light-emitting elements is guided to an image capture range by a light-guiding element to provide illumination, so that an image capture device can be realized in which the image capture system and the illumination system are in proximity; protrusions in the light-guiding member are pressed by the lower end of a hood which blocks light from outside the image capture range, and the hood upper end is pressed by a filter, so that a compact image capture device in which bonding is kept to a minimum can be realized, workability in assembly of the image capture device is enhanced, and defect rates are lowered, contributing to improved manufacturing efficiency. Further, slits are provided in the hood lower end, so that a visible light filter can be installed on the hood, and the visible light filter can be fixed to an outer case, eliminating a bonding process, and upon assembly, the occurrence of gaps between the hood and the visible light filter can be prevented through the spring action of the slits. Hence light other than light irradiating the subject for image capture can be prevented from intruding into the optical unit 34 from gaps, outside light can be blocked, and distinct images can be captured.

What is claimed is:

1. An image capture device, which illuminates a subject, receives light reflected from the subject, and captures an image of the subject, comprising:
   an image sensor, which receives the reflected light;
   a plurality of light-emitting elements, mounted in positions on the periphery of the image sensor;
   a light-guiding member, which guides light from the plurality of light-emitting elements to an image capture range and illuminates the image capture range;
   an optical unit, accommodated within the light-guiding member, to guide light reflected by a subject within the illuminated image capture range to the image sensor;
   an optical filter, provided on a subject side of the optical unit and the light-guiding member, and installed in a case;
   a hood for blocking light outside the image capture range of the optical unit;
   a plurality of protrusions provided on the light-guiding member and pressed by a lower end of the hood of which an upper end of the hood is pressed by the optical filter installed in the case; and
   a slit provided in the lower portion of the hood.

2. The image capture device according to claim 1, wherein a positioning rib, which positions the hood at the protrusions, is provided at a position corresponding to the slit at the lower end of the hood.

3. The image capture device according to claim 2, wherein at the lower end of the hood a plurality of slits are provided, and a plurality of positioning ribs are provided.

4. The image capture device according to claim 2, wherein a pair of the positioning ribs are provided at the lower end of the hood, so as to sandwich the protrusions of the light-guiding member.

5. The image capture device according to claim 2, wherein a plurality of the slits, and a plurality of the positioning ribs, are provided at the lower end of the hood, corresponding to the plurality of protrusions of the light-guiding member.

6. The image capture device according to claim 5, wherein the plurality of protrusions are provided at different positions in a circumferential direction on an inner face of the light-guiding member, and the plurality of slits and the plurality of positioning ribs are provided on the lower end of the hood, corresponding to the plurality of protrusions.

7. The image capture device according to claim 2, wherein a positioning rib which positions the hood at the protrusions is provided at a position corresponding to the center of the slits on the lower end of the hood.

8. The image capture device according to claim 2, wherein the hood comprises:
   a pressing portion which supports the optical unit;
   a hood outer wall which blocks light outside the image capture range;
   the slit provided in a lower portion of the outer wall; and
   the positioning ribs which press the protrusions of the light-guiding member.

9. The image capture device according to claim 1, wherein the hood further comprises a flange provided in an upper portion of the hood.

10. The image capture device according to claim 1, further comprising:
   a circuit board, on which are mounted the image sensor, the plurality of light-emitting elements, and a light-emitting element for distance measurement;
   an aperture which is mounted on the circuit board, and concentrates light emitted by the light-emitting element for distance measurement in a spot to irradiate the subject; and
   a supporting block which is provided on a portion of the aperture, and supports a portion of the lower end of the light-guiding member.

11. The image capture device according to claim 1, wherein the light-guiding member comprises:
- a lower-end portion for taking in light from the light-emitting elements;
- an upper-end portion for emitting light to the image-capture range; and
- a light-guiding portion for guiding light from the light-emitting elements from the lower-end portion to the upper-end portion.

12. The image capture device according to claim 1, wherein the plurality of light-emitting elements are mounted on the circuit board along a circle peripheral to the image sensor at predetermined intervals, and the light-guiding member is configured in a ring shape corresponding to the circle.

13. The image capture device according to claim 1, further comprising:
- a diffusing/polarizing plate, which is provided between the light-guiding member and the plurality of light-emitting elements, and diffuses and polarizes light from the light-emitting elements; and
- a mounting base, which is provided on the circuit board, and on which the diffusing/polarizing plate is mounted.

14. The image capture device according to claim 10, wherein the light-emitting element for distance measurement is mounted on the circuit board, in a position outside the light-emitting elements.

15. The image capture device according to claim 1, wherein the plurality of light-emitting elements are light-emitting elements which emit infrared light, and the optical filter is an optical filter which filters visible light.

16. The image capture device according to claim 14, wherein the light-emitting element for distance measurement comprises four light-emitting elements which are mounted on the circuit board at positions outside the light-emitting elements, in a diagonal relation.

17. The image capture device according to claim 13, further comprising:
- a control board, connected to the circuit board, for connection to external equipment; and
- a slot, provided in a holder assembly, for supporting the control board.

18. The image capture device according to claim 1, wherein the image sensor captures images of a human body portion.

* * * * *